United States Patent [19]

Smythe

[11] Patent Number: 5,041,754

[45] Date of Patent: Aug. 20, 1991

[54] CRYSTAL RESONATOR WITH ACCELERATION SENSITIVITY ADJUSTABLE BY EXTERNAL CIRCUIT MEANS

[75] Inventor: Robert C. Smythe, Orlando, Fla.

[73] Assignee: Piezo Technology Inc., Orlando, Fla.

[21] Appl. No.: 521,179

[22] Filed: May 9, 1990

[51] Int. Cl.$^5$ .............................. H01L 41/08
[52] U.S. Cl. .................... 310/366; 310/320; 310/317
[58] Field of Search ............ 310/317, 320, 366

[56] References Cited

U.S. PATENT DOCUMENTS

| | | | |
|---|---|---|---|
| 2,859,346 | 9/1958 | Firestone | 310/320 |
| 2,886,787 | 5/1959 | Broadhead | 310/320 |
| 3,739,299 | 6/1973 | Adler | 310/317 |
| 3,882,332 | 5/1975 | Frymoyer | 310/320 |
| 3,980,905 | 9/1976 | Miller | 310/317 |
| 4,833,358 | 5/1989 | Suzuki et al. | 310/317 |

FOREIGN PATENT DOCUMENTS

| | | | |
|---|---|---|---|
| 0862778 | 7/1949 | Fed. Rep. of Germany | 310/366 |
| 3123104 | 5/1982 | Fed. Rep. of Germany | 310/317 |
| 0728292 | 12/1966 | Italy | 310/320 |

OTHER PUBLICATIONS

"Communications Systems Benefit from Monolithic Crystal Filters", by R. Smythe, Electronics, 1-31-72, pp. 48-51.

Primary Examiner—Mark O. Budd
Assistant Examiner—Thomas M. Dougherty
Attorney, Agent, or Firm—Darby & Darby

[57] ABSTRACT

A crystal resonator device having a plurality of coupled resonators in which the relative phase and magnitude of the resonator excitation currents is controlled by electrical circuit means such as reactance components connected in series with one or more of the resonators to thereby minimize or otherwise control the acceleration sensitivity of the device.

17 Claims, 3 Drawing Sheets

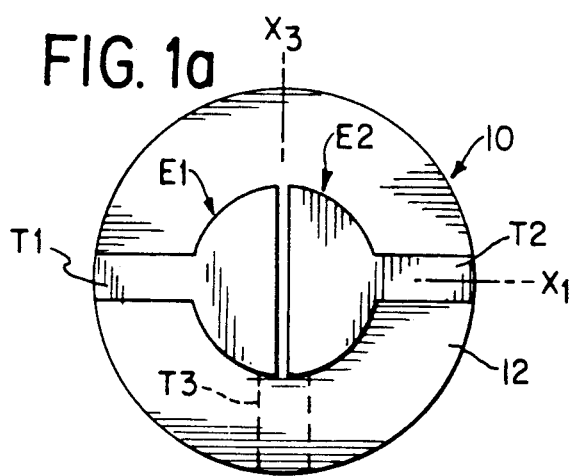
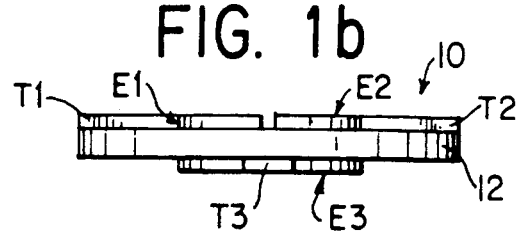
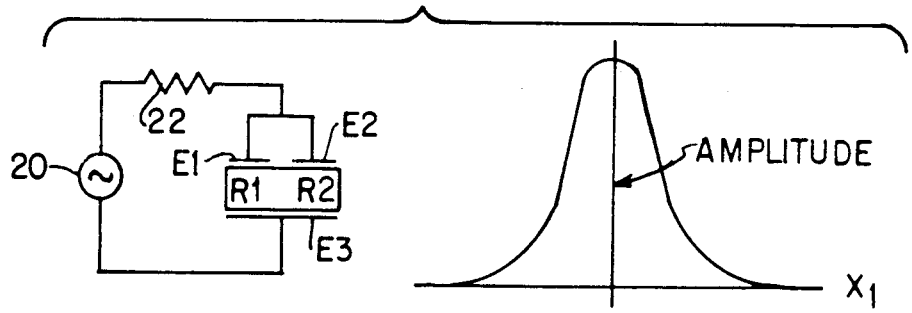
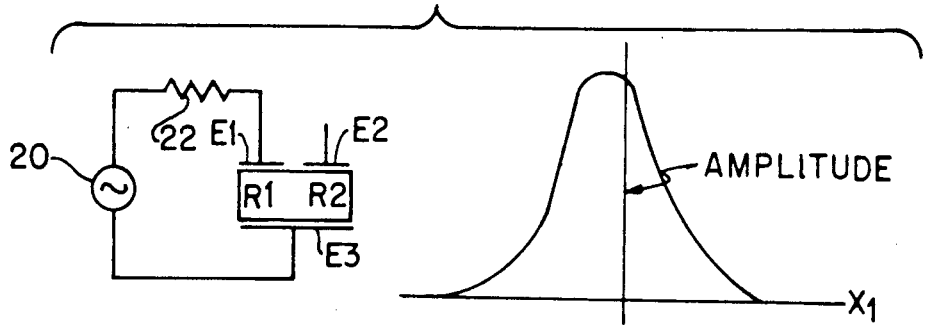
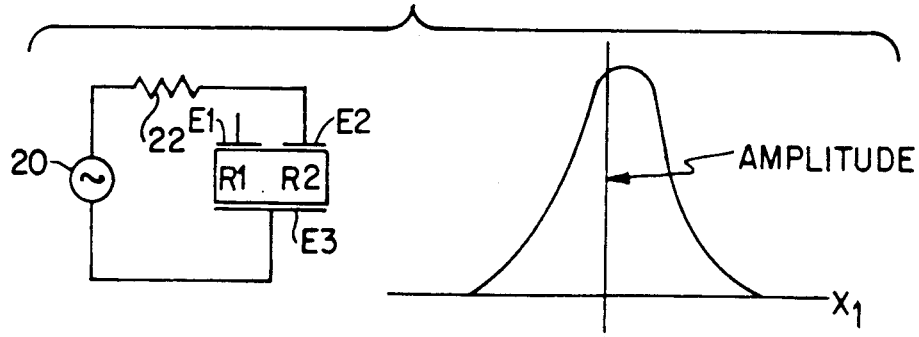

CRYSTAL RESONATOR WITH ACCELERATION SENSITIVITY ADJUSTABLE BY EXTERNAL CIRCUIT MEANS

BACKGROUND OF THE INVENTION

This invention relates to crystal resonators manufactured to control their acceleration sensitivity.

Piezoelectric quartz crystal resonators are used to develop highly accurate timing signals and reference frequencies for such applications as communications, navigation and radar. In particular, resonant frequencies of thickness shear mode quartz resonators are commonly used as timing standards in crystal-controlled oscillators.

In spite of the relative stability and precision of the frequency output of such quartz resonator controlled oscillators, frequency shifts and thus timing errors can occur when the resonator is subjected to acceleration (or gravity) caused stresses. These stresses are produced in the resonator as a result of interaction between the resonator crystal and its mounting or holding structure. Investigations have generally been unsuccessful in identifying effects, or whether there is any effect, of various parameters (crystal geometry, angle of cut, temperature, etc.) on acceleration sensitivity (see Filler et al "Further Studies on the Acceleration Sensitivity of Quartz Resonators", Proc. 37th Annual Symposium on Frequency Control, 1983, pp. 265-271; and Raymond L. Filler, "The Acceleration Sensitivity of Quartz Crystal Oscillators: A Review", Proc. 41st Annual Symposium on Frequency Control, May, 1987, pp. 398-408). Accordingly, there is a need for crystal oscillators and crystal resonators having low acceleration sensitivity.

Piezoelectric resonators, especially such devices as AT- and SC- cut quartz crystal resonators, are used in a number of applications in which they are subjected to acceleration, especially sinusoidal and random vibration, while operating. Acceleration causes the resonance frequency of a crystal resonator to change. For accelerations which are not too large, the frequency change is the scalar (dot) product of two spatial vector quantities, the acceleration sensitivity of the resonator and the acceleration (Raymond L. Filler, "The Acceleration Sensitivity of Quartz Crystal Oscillators: A Review", Proc. 41st Annual Symposium on Frequency Control, May 1987, pp. 398-408).

The acceleration sensitivity of a piezoelectric resonator depends upon two factors—the deformation produced by the acceleration and the mode shape. While the mathematical analysis is complex, the basic idea is simple and is described in "An Analysis of the Normal Acceleration Sensitivity of Contoured Quartz Resonators Rigidly Supported Along the Edges", H. F. Tiersten & D. V. Shick, Proceedings of the IEEE Ultrasonics Symposium, 1988, pp. 357-363. At each point in the resonator, acceleration-induced deformation alters the effective elastic stiffness of the resonator, thereby incrementally affecting the resonance frequency of each mode of vibration by an amount that depends upon the mode amplitude and sign and upon the amplitude and sign of the deformation at that point. While the mode amplitude is referred to here as if it were a single quantity, it should be recognized that the mode of vibration employed may have two or even more components, all of which may contribute to the total acceleration sensitivity. Similarly, the acceleration-induced deformation will, in general, have more than one component.

The total effect on the resonance frequency of a particular mode is the algebraic sum of the incremental effects taken over the entire volume of the resonator. Thus, the acceleration sensitivities of different modes of the same resonator are, in general, different from one another. For regions of the resonator where the amplitude of vibration is small, the incremental effect is small. Similarly, where the deformation is relatively small the effect will be relatively small. An extremely important aspect of the summation is that, due to symmetry, a high degree of cancellation takes place; that is, the sum of the positive increments is very nearly equal to the sum of the negative increments.

In a conventional thickness-mode quartz crystal unit, a suitably dimensioned and electroded platelet or wafer of quartz, commonly called a blank, is supported at two or more points on its periphery by metal ribbons or clips, which in turn are fastened to a header or base. Under acceleration, the body forces on the blank are balanced by reaction forces of the support structure. Thus, the support structure determines the acceleration-induced deformation of the blank. The mode shape of the resonator is determined by an energy-trapping mechanism. For a plano-plano resonator, the primary controls are the lateral dimensions of the electrodes, including the tabs, the electrode mass loading, and the piezoelectric loading. However, the mode shape, and hence the acceleration sensitivity, will also unavoidably be affected by point-to-point variations in the thickness of the blank (i.e. non-parallelism) or even of the electrode, as well as by material defects such as inclusions and etch channels. For contoured resonators, mode shape is primarily controlled by contour, but will also be affected to some degree by the electrodes and by material defects.

Because of fabrication limitations, variations from resonator to resonator in support geometry, in electrode dimensions, and in blank contour are unavoidable. Because the resonator acceleration sensitivity is the difference of two nearly equal quantities, small changes in the resonator, representing normal manufacturing tolerances, can cause large changes in resonator acceleration sensitivity. This is borne out by experience.

Consequently, it is desirable to have a means of adjusting, or trimming, the acceleration sensitivity in order to minimize its magnitude or the magnitude of one or more of its vector components. In principle, this may be accomplished by altering either the mode shape or the acceleration-induced deformation. The latter might be accomplished, say, by modifying the mounting structure. One method by which the mode shape may be altered is to add or remove mass from selected regions of the blank (U.S. Pat. No. 4,837,475 issued Jun. 6, 1989, EerNisse et al.

BRIEF DESCRIPTION OF THE INVENTION

The present invention relates to the art of external circuit techniques with a crystal resonator by which the mode shape may be modified in order to minimize or otherwise control the acceleration sensitivity. In accordance with the invention a single plate of piezoelectric material is provided which has a plurality of electrodes either deposited thereon or of the air-gap type to form at least a pair of resonators which are coupled by the acoustic energy and device means sometimes called a monolithic dual resonator. External circuit means is provided to vary, in magnitude and phase, the relative excitation of the resonators, thereby varying the shape of the composite mode. Such circuit means may be in the form of one or more reactive components such as capacitors or inductors connected in series with the electrodes of such resonators to control the shape of the mode. Other arrangements will be apparent to one skilled in the art. By suitably selecting the reactive components and their values based upon the acceleration forces to which the device is to be subjected, the degree of symmetry of the mode shape relative to one or more axes of the resonator can be selected, thereby reducing the frequency change due to acceleration.

An advantage of this technique over those which depend upon the addition or removal of mass or upon the alteration or adjustment of the mounting clips, or upon other alterations to the resonator structure, is that the circuit adjustments are external to the resonator and may be carried out after its manufacture is complete. Techniques for trimming acceleration sensitivity, by modifying the resonator structure, on the other hand, must be carried out as part of the resonator manufacturing process, while the resonator is in a partially completed state. Thus, they are extremely cumbersome and costly.

OBJECTS OF THE INVENTION

It is therefore an object of the invention to provide a crystal resonator with low sensitivity to forces of acceleration.

A further object is to provide a crystal resonator which is compensated by external circuit means to control the mode shape and reduce or otherwise control acceleration sensitivity.

Another object is to provide a coupled resonator using external means such as reactances to control the mode shape and thereby reduce acceleration sensitivity.

Still an additional object is to reduce acceleration sensitivity in a multi-mode crystal resonator by the use of external circuit components.

BRIEF DESCRIPTION OF THE DRAWINGS

Other objects and advantages of the invention will become more apparent upon reference to the following specification and annexed drawings in which;

FIGS. 1a and 1b are top and end views of a dual mode resonator device;

FIGS. 2a, 2b and 2c are schematic views of the effect of excitation via different electrodes or the lack thereof on the resonator mode shape of a dual mode resonator;

FIG. 5 is a schematic diagram of the use of reactances with the resonator of FIG. 4a;

FIG. 6c is a schematic diagram of the use of reactance components with the resonator device of FIG. 6a.

DETAILED DESCRIPTION OF THE INVENTION

Figure 3A:
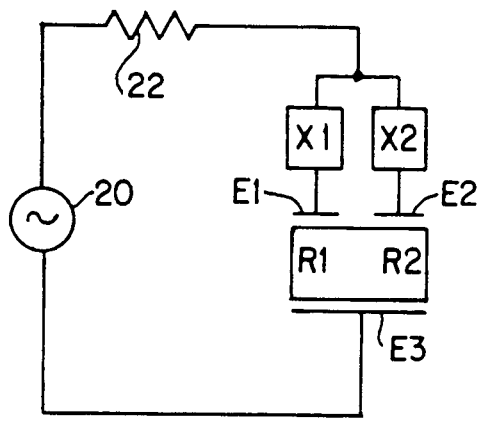
FIGS. 3a and 3b are schematic representations of the dual mode resonator with reactances inserted to accomplish the principles of the invention.

The principles of the invention are explained by reference to FIGS. 1a and 1b. These show a thickness mode resonator 10 having a plate 12 of piezoelectric material 12, such as AT cut quartz. Axes $x_1$ and $x_3$ are a pair of orthogonal coordinate axes lying in the plane of the plate 12. They may correspond to rotated crystallographic axes or may be otherwise selected, as desired. A pair of electrodes E1 and E2 having corresponding terminals or tabs $T_1$ and $T_2$ are formed on one surface of the plate 12. A common electrode E3 and its tab T3 are formed on the other blank surface. The tabs T1, T2 and T3 couple energy into and out of the resonator 10.

For the device shown, one electrode has been divided in a direction normal to axis $x_1$ so that the device can now be considered as two resonators, R1 and R2, with associated electrodes E1 and E2. A common electrode E3 is on the opposing surface of the plate below electrodes E1 and E2. The deposition of the electrodes and tabs is accomplished in any conventional well-known manner using conventional materials such as silver, gold, aluminum, etc., and, in themselves, form no part of the invention. Moreover, air-gap electrodes can be used within the scope of the invention. By virtue of their proximity to one another R1 and R2 are acoustically coupled to a greater or lesser degree; i.e., the device is now a monolithic dual resonator.

For purposes of explanation, consider the device to be perfectly symmetrical. When E1 and E2 are connected together and driven electrically, see FIG. 2a, only the modes symmetric about the $x_3$ axis are excited. The amplitude along the $x_1$ axis of one such mode is plotted in FIG. 2a.

When only E1 is electrically excited, as shown in FIG. 2b, the mode shifts to the left, toward R1; however, R2 is also excited to some degree since it is acoustically coupled to R1. At the same time, the mode shape changes and is no longer symmetrical, and the resonance frequency changes. Similarly, when only E2 is electrically excited, as shown in FIG. 2c, the mode shifts to the right, toward R2.

The foregoing shows that by controlling the relative excitation of E1 and E2 (i.e., weighing the excitation currents to the respective electrodes), the shape of the mode and its position along $x_1$ can be controlled. Since the acceleration sensitivity depends strongly upon the mode shape and location, varying the relative excitation of E1 and E2 will cause the acceleration sensitivity to vary.

The effect of exciting E1 differently from E2 can also be explained from another viewpoint. In FIG. 2a, the excitation is symmetric. Since the device is also symmetric, only symmetric modes are excited. In FIGS. 2b and 2c, the excitation is no longer symmetric, but can be considered as the sum of a symmetric excitation and an antisymmetric excitation. Hence, both symmetric and antisymmetric modes are excited, although unequally, so that for these connections the device will have resonances whose mode shapes are neither symmetric nor antisymmetric.

It will be understood that an actual device is not perfectly symmetrical, and unit-to-unit variations in mode shape and acceleration-induced stresses, while they can be controlled within limits, are unavoidable. By suitably proportioning the relative excitations of E1 and E2, the effective mode shape can be selected so as to minimize or otherwise control the resonator acceleration sensitivity.

Figure 3B:
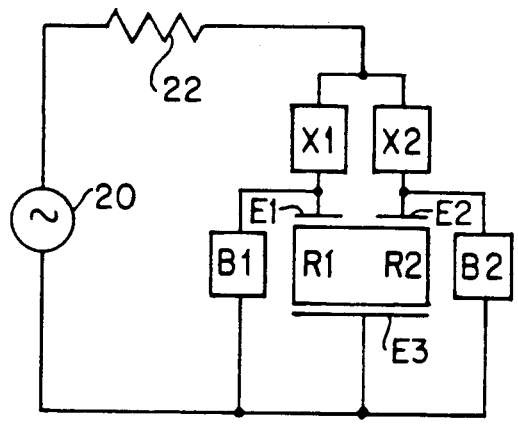

FIGS. 3a and 3b show, in general form, several circuit techniques by which the relative excitation of E1 and E2 may be controlled. In FIG. 3a, there is a source of energy 20, e.g. an oscillator, for supplying the excitation voltages to the resonator device 10, through a current limiting resistor 22. Reactances X1 and X2, may be either capacitors or inductors or combinations thereof. Also, amplifiers and other devices can be used. The reactances are connected in series with E1 and E2, generally through the corresponding tabs T1 and T2, respectively, and the source.

Using X1 and X2, the relative amplitudes and phases of the currents into electrodes E1 and E2 can be varied. This changes the position of the mode in the $x_1$ direction, as described with respect to FIG. 1. It should be understood that each of the reactances X1 and X2 can be different so that the excitation for each resonator can be different making the mode of the two coupled resonators symmetric or asymmetric in the $x_1$ direction as required to achieve low acceleration sensitivity.

In FIG. 3b, susceptances B1 and B2 have been added. These might be used, for example, to extend the range of control obtainable with X1 and X2. The susceptances could be, for example, as described with respect to FIG. 1. It should be understood that each of the susceptances B1 and B2, as well as the reactances X1 and X2, can be different so that the mode control for each resonator can be different making the mode of the two coupled resonators symmetrical or asymmetrical in the $x_1$ direction as desired.

Figure 4A:
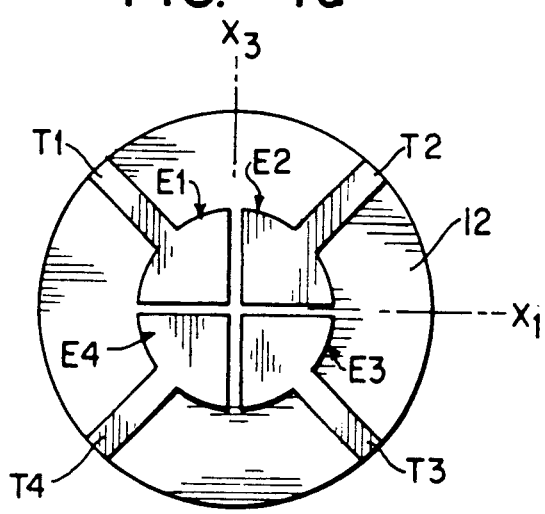
FIGS. 4a and 4b are top views of other types of multi-mode resonator devices.

The principles of the invention can be extended to two dimensions. In FIG. 4a, four electrodes E1, E2, E3 and E4 have been formed on one face of the blank. There is a common electrode on the other blank face to form four resonators R1, R2, R3 and R4. Acoustic coupling exists between all four resonators R1, R2, R3 and R4. By controlling the relative excitation of the four resonators, the position of the mode with respect to both $x_1$ and $x_3$ axes can be varied. This can be done using the circuit techniques of FIG. 3, as illustrated in FIG. 5.

Figure 5:
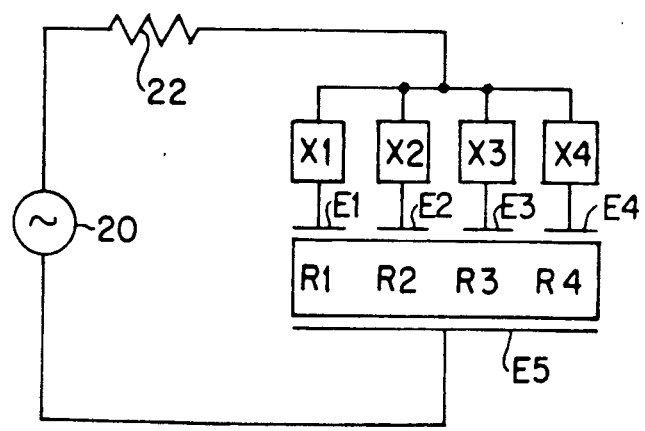

In FIG. 5, a reactance X1, X2, X3, X4 is respectively connected in series with each electrode E1, E2, E3 and E4 of the respective resonators R1, R2, R3 and R4. There is acoustic coupling in the $x_1$ axis direction between resonator pairs R1-R2 and R3-R4 and in the $x_3$ axis direction between resonator pairs R1-R4 and R2-R3. While there is some cross-coupling between pairs R1-R3 and R2-R4, such coupling is minor thus, for each axis there are a symmetric and an antisymmetric mode to contend with in the same manner as described with respect to FIGS. 1-3. By suitably adjusting X1, X2, X3 and X4, the shape in axis direction $x_1$ and $x_3$ of the excited mode can be made to be either symmetrical or asymmetrical.

Figure 4B:
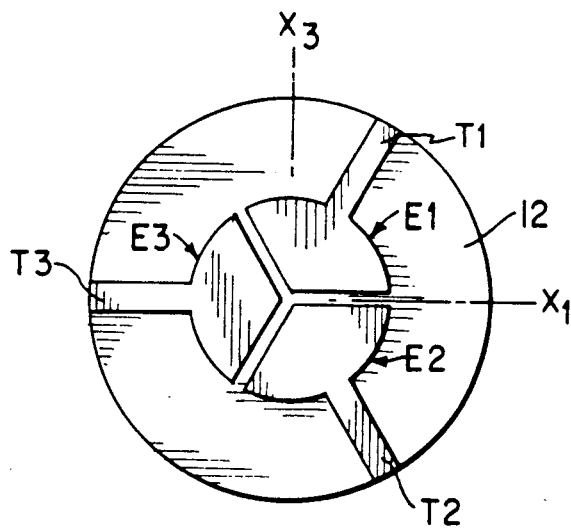

Other electrode configurations are possible, such as FIG. 4b, in which three electrodes E1, E1 an E3 have been formed on one face of the blank and a common electrode on the other face. The device can again be described in terms of modes symmetric and antisymmetric about the $x_1$ and $x_3$ axes, and by suitably adjusting X1, X2 an X3 the shape in axis directions $x_1$ and $x_3$ of the excited mode can be made to be either symmetrical or asymmetrical. The FIG. 4b configuration has fewer electrodes than FIG. 4a and requires fewer reactances to achieve the desired degree of mode symmetry.

Figure 6A:
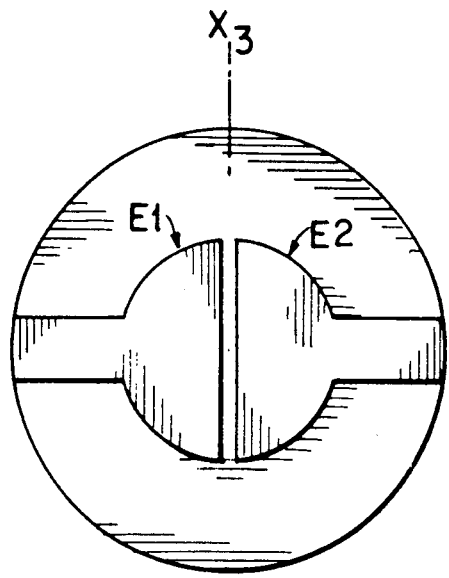
FIGS. 6a and 6b are a top and bottom view of another type of resonator device.
Figure 6B:
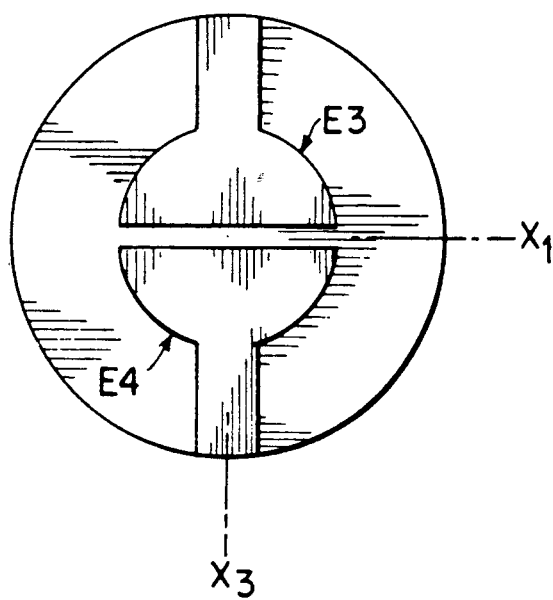
Figure 6C:
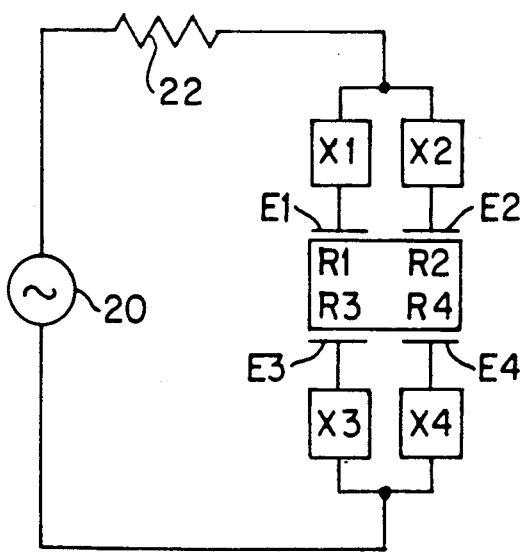

Another embodiment is shown in FIG. 6a, and 6b in which instead of having a common electrode on one face of the blank, the electrodes on the faces of the blank are divided with E1 and E2 on one face and E3-E4 on the other face. This configuration provides another way of independently controlling the $x_1$ and $x_3$ axis positions of the mode. In FIG. 6c there is an individual reactance X in series with each of the electrodes E1-E4. Reactances X1 and X2 control the $x_1$ axis position, while reactances X3 and X4 control the $x_3$ axis position.

While the foregoing descriptions assumed a symmetrical device, the techniques described do not require that the device be symmetrical. It is a purpose of these techniques to correct the acceleration sensitivity for the unavoidable deviations from symmetry found in actual devices. For example, the location of the mounting ribbons is often not accurately reproduced from unit to unit. While improved manufacturing methods may reduce such variations, it is nevertheless desirable to have a means for trimming or adjusting the acceleration sensitivity as can be accomplished using the subject invention.

What is claimed is:

1. A crystal monolithic dual resonator device with reduced sensitivity to acceleration for operation from a source of excitation current comprising:
    a blank of piezoelectric material, electrodes on or near said blank forming at least two resonators each having a pair of electrodes to which resonators are acoustically coupled,
    means for supplying the excitation current to one of the electrodes of the pair of electrodes of each resonator,
    and means connected to the excitation current supplying means of at least one of the resonators for modifying the magnitude and phase of the applied excitation current to control the symmetry of the excited mode of the resonator and the device in a manner for reducing frequency change of the resonator due to acceleration.

2. A crystal resonator device as in claim 1 wherein said modifying means comprises a reactance element.

3. A crystal resonator as in claim 1 wherein the modifying means is in series between the source of excitation current and each said resonator.

4. A crystal resonator as in claim 3 further comprising additional modifying means connected in parallel with the pair of electrodes of a resonator.

5. A crystal resonator as in claim 4 wherein said additional modifying means comprises a susceptance element.

6. A crystal resonator as in claim 1 wherein a said modifying means is connected to each of said resonators.

7. A crystal resonator as in claim 5 wherein each said modifying means comprises a reactance element.

8. A crystal resonator as in claim 7 wherein each said modifying means is in series between the source of excitation current and each said resonator.

9. A crystal resonator as in claim 8 further comprising additional modifying means connected in parallel with the electrodes of a resonator.

10. A crystal resonator as in claim 9 wherein said additional modifying means comprises a susceptance element.

11. A crystal resonator as in claim 1 wherein said plurality of electrodes form four coupled resonators each having a pair of electrodes.

12. A crystal resonator as in claim 11 wherein there is a modifying means connected to each said resonator.

13. A crystal resonator as in claim 12 wherein a modifying means is connected in series between the source of excitation current and each said resonator.

14. A crystal resonator as in claim 1 wherein said plurality of electrodes form three coupled resonators.

15. A crystal resonator as in claim 6 wherein a pair of resonators are each formed by a pair of electrodes, one electrodes of each pair on each side of the blank, a said modifying means being in series between the source of excitation current and each said electrode of a resonator.

16. A crystal resonator as in claim 15 wherein each said modifying means is a reactance element.

17. A crystal resonator as in claim 1 wherein there is a modifying means in series between the source of excitation current and each electrode of the pair of electrodes of each resonator.

* * * * *